United States Patent
Kang et al.

(10) Patent No.: US 10,614,871 B2
(45) Date of Patent: Apr. 7, 2020

(54) SEMICONDUCTOR DEVICES AND SEMICONDUCTOR SYSTEMS INCLUDING THE SEMICONDUCTOR DEVICES

(71) Applicant: SK hynix Inc., Icheon-si, Gyeonggi-do (KR)

(72) Inventors: Dong Ho Kang, Icheon-si (KR); Jin Wook Kim, Yongin-si (KR); Yang Uk Son, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/210,888

(22) Filed: Dec. 5, 2018

(65) Prior Publication Data
US 2020/0066325 A1    Feb. 27, 2020

(30) Foreign Application Priority Data
Aug. 27, 2018    (KR) .................. 10-2018-0100606

(51) Int. Cl.
| | |
|---|---|
| *G11C 11/34* | (2006.01) |
| *G11C 11/4076* | (2006.01) |
| *G11C 11/4093* | (2006.01) |
| *G11C 11/4096* | (2006.01) |
| *G11C 7/10* | (2006.01) |
| *G11C 7/22* | (2006.01) |
| *G11C 11/4094* | (2006.01) |
| *G11C 11/408* | (2006.01) |

(52) U.S. Cl.
CPC .......... *G11C 11/4076* (2013.01); *G11C 7/109* (2013.01); *G11C 7/1063* (2013.01); *G11C 7/222* (2013.01); *G11C 11/4087* (2013.01); *G11C 11/4093* (2013.01); *G11C 11/4094* (2013.01); *G11C 11/4096* (2013.01)

(58) Field of Classification Search
CPC ... G11C 11/4076; G11C 7/1063; G11C 7/109; G11C 7/222; G11C 11/4087; G11C 11/4093; G11C 11/4094; G11C 11/4096
USPC ............................................. 365/174
See application file for complete search history.

(56) References Cited

U.S. PATENT DOCUMENTS

| | | | |
|---|---|---|---|
| 5,748,560 A | 5/1998 | Sawada | |
| 7,102,938 B2 * | 9/2006 | Kang | .............. G11C 5/147 365/189.05 |

FOREIGN PATENT DOCUMENTS

KR    100792367 B1    1/2008

* cited by examiner

*Primary Examiner* — Huan Hoang
(74) *Attorney, Agent, or Firm* — William Park & Associates Ltd.

(57) ABSTRACT

A semiconductor device includes a delay circuit and a column signal generation circuit. The delay circuit delays a write signal by a sum of a write latency time and a burst operation time to generate a write pulse, delays a read signal to generate a read pulse, and generates a pre-charge signal which is enabled after a predetermined period elapses from a time when the write signal is generated. The column signal generation circuit generates a column signal from a chip selection signal and a command/address signal when the write pulse or the read pulse is inputted to the column signal generation circuit. The column signal is a signal for selecting at least one memory cell included in one of a plurality of banks.

33 Claims, 9 Drawing Sheets

FIG. 2

| | CS | CA<1> | CA<2> | CA<3> | CA<4> | CA<5> |
|---|---|---|---|---|---|---|
| 1st | H | L | L | H | L | L |
| | L | BADD<1> | BADD<2> | BADD<3> | | CADD<1> |
| 2nd | H | L | H | L | L | H |
| | L | CADD<2> | CADD<3> | CADD<4> | CADD<5> | CADD<6> |
| 3rd | H | L | H | L | L | L |
| | L | BADD<1> | BADD<2> | BADD<3> | | CADD<1> |
| 4th | H | L | H | L | L | H |
| | L | CADD<2> | CADD<3> | CADD<4> | CADD<5> | CADD<6> |

SEMICONDUCTOR DEVICES AND SEMICONDUCTOR SYSTEMS INCLUDING THE SEMICONDUCTOR DEVICES

CROSS-REFERENCE TO RELATED APPLICATIONS

The present application claims priority under 35 U.S.C 119(a) to Korean Application No. 10-2018-0100606, filed on Aug. 27, 2018, which is incorporated herein by reference in its entirety.

BACKGROUND

1. Technical Field

Embodiments of the present disclosure relate to semiconductor devices and semiconductor systems including the semiconductor devices, and more particularly, to semiconductor devices sequentially executing a write operation, a read operation, and a pre-charge operation and semiconductor systems including the same.

2. Related Art

In general, semiconductor memory devices, such as dynamic random access memory (DRAM) devices, may include a plurality of memory cells for storing data. DRAM cells may be configured to include a cell capacitor and a cell transistor. The DRAM cells may be connected to bit lines and may constitute a plurality of memory banks.

The semiconductor memory devices may be configured to perform a write operation for storing data in the memory cells, a read operation for outputting data stored in the memory cells, and a pre-charge operation for improving an operation speed of the read operation or the write operation. The pre-charge operation is performed after a write recovery time (tWR) corresponding to a physical time necessary for storing data in the semiconductor memory device from a point in time when data are inputted to the semiconductor device in the write operation.

SUMMARY

According to an embodiment, a semiconductor device includes a delay circuit and a column signal generation circuit. The delay circuit delays a write signal by a sum of a write latency time and a burst operation time to generate a write pulse, delays a read signal to generate a read pulse, and generates a pre-charge signal which is enabled after a predetermined period elapses from a time when the write signal is generated. The column signal generation circuit generates a column signal from a chip selection signal and a command/address signal when the write pulse or the read pulse is inputted to the column signal generation circuit. The column signal is a signal for selecting at least one memory cell included in one of a plurality of banks.

According to another embodiment, a semiconductor device includes a command decoder, a delay circuit, and a column signal generation circuit. The command decoder is synchronized with a clock signal to generate a write signal and a read signal, which are sequentially enabled according to a chip selection signal and a logic level combination of a command/address signal. The delay circuit delays the write signal by a first delay time according to a write latency information signal and a burst operation information signal to generate a write pulse, delays the read signal to generate a read pulse, and delays the write pulse by a second delay time according to a write recovery signal to generate a pre-charge signal. The column signal generation circuit generates a column signal from the chip selection signal and the command/address signal when the write pulse or the read pulse is inputted to the column signal generation circuit. The column signal is a signal for selecting at least one memory cell included in one of a plurality of banks.

According to another embodiment, a semiconductor system includes a first semiconductor device and a second semiconductor device. The first semiconductor device outputs a chip selection signal, a clock signal, a command/address signal, a write latency information signal, a burst operation information signal, and a write recovery signal. In addition, the first semiconductor device receives and/or outputs data. The second semiconductor device is synchronized with the clock signal to sequentially perform a write operation and a read operation for a bank activated according to the chip selection signal and a logic level combination of the command/address signal. Moreover, the second semiconductor device is synchronized with the clock signal to perform a pre-charge operation according to the write latency information signal, the burst operation information signal, and the write recovery signal after the read operation is performed.

BRIEF DESCRIPTION OF THE DRAWINGS

FIG. 2 shows a table illustrating various logic level combinations of a command address for an operation of a semiconductor device, according to an embodiment of the present disclosure.

DETAILED DESCRIPTION OF THE EMBODIMENTS

Various embodiments of the present disclosure are described herein with reference to the accompanying drawings. However, the described embodiments are for illustrative purposes only and are not intended to limit the scope of the present disclosure.

Figure 1:
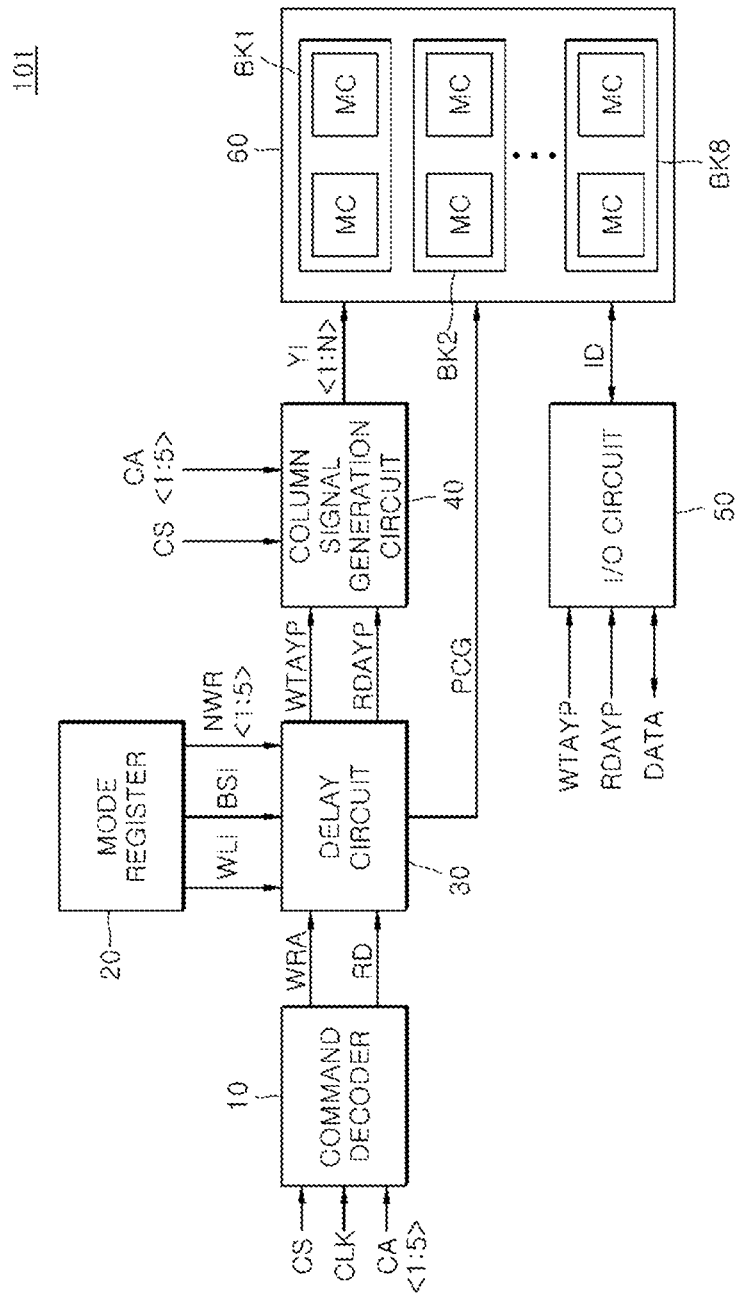
FIG. 1 shows a block diagram illustrating a configuration of a semiconductor device, according to an embodiment of the present disclosure.

As illustrated in FIG. 1, a semiconductor device 101 according to an embodiment may include a command decoder 10, a mode register 20, a delay circuit 30, a column signal generation circuit 40, an input/output (I/O) circuit 50, and a core circuit 60.

The command decoder 10 may be synchronized with a clock signal CLK to generate a write signal WRA and a read signal RD, which are sequentially enabled according to a chip selection signal CS and a logic level combination of first to fifth command/address signals CA<1:5> (also referred to in the singular as a command/address signal). The command decoder 10 may be synchronized with the clock signal CLK to generate the write signal WRA according to a logic level combination of the first to fifth command/address signals CA<1:5> while a first pulse and a second pulse of the chip selection signal CS are inputted to the command decoder 10. The command decoder 10 may be synchronized with the clock signal CLK to generate the read signal RD according to a logic level combination of the first to fifth command/address signals CA<1:5> while a third pulse and a fourth pulse of the chip selection signal CS are inputted to the command decoder 10. The first to fourth pulses of the chip selection signal CS may be set as four pulses having a logic "high" level, which are sequentially inputted to the command decoder 10. In some other embodiments, the first to fourth pulses of the chip selection signal CS may be set as four pulses having a logic "low" level. The chip selection signal CS and logic level combinations of the first to fifth command/address signals CA<1:5> for generating the write signal WRA and the read signal RD are described in detail below with reference to FIG. 2.

The mode register 20 may include a plurality of registers. The mode register 20 may output a write latency information signal WLI, a burst operation information signal BSI, and first to fifth write recovery signals NWR<1:5> (also referred to in the singular as a write recovery signal). The write latency information signal WLI may be a signal for setting a write latency time. The write latency information signal WLI may include information on a time necessary for input of data from a time when the first to fifth command/address signals CA<1:5> for a write operation are inputted to the semiconductor device 101. Even though FIG. 1 illustrates the write latency information signal WLI with a single line, the write latency information signal WLI may be implemented as a signal including a plurality of bits according to some embodiments. The burst operation information signal BSI may be a signal for setting a burst operation time. The burst operation information signal BSI may include information on a burst length of data processed during a write operation and a read operation that are performed when the command/address signals CA<1:5> are inputted once. Even though FIG. 1 illustrates the burst operation information signal BSI with a single line, the burst operation information signal BSI may be implemented as a signal including a plurality of bits according to some embodiments. The first to fifth write recovery signals NWR<1:5> may be signals for setting a write recovery time tWR. Even though the first to fifth write recovery signals NWR<1:5> are denoted as including five bits, the number of bits included in the write recovery signals may be less or greater than five in other embodiments.

The delay circuit 30 may receive the write signal WRA and the read signal RD to generate a write pulse WTAYP, a read pulse RDAYP, and a pre-charge signal PCG, which are sequentially enabled. The delay circuit 30 may delay the write signal WRA by a sum of the write latency time and the burst operation time to generate the write pulse WTAYP. The delay circuit 30 may delay the read signal RD to generate the read pulse RDAYP. The delay circuit 30 may generate the pre-charge signal PCG, which is enabled after a predetermined period elapses from a time when the write signal WRA is generated. The delay circuit 30 may delay the write signal WRA according to the write latency information signal WLI and the burst operation information signal BSI to generate the write pulse WTAYP. The delay circuit 30 may delay write pulse WTAYP according to the first to fifth write recovery signals NWR<1:5> to generate the pre-charge signal PCG. The predetermined period may be set as a time which is greater than a total operation time of the write operation and the read operation that are sequentially performed. The predetermined period may be set to be longer than the write recovery time tWR. The write recovery time tWR may be set as a minimum delay time for performing a pre-charge operation from a time when data are inputted to the semiconductor device 101 during the write operation. That is, the write recovery time tWR may be set as a minimum interval time between a time when data are inputted to the semiconductor device 101 during the write operation and a time when the pre-charge operation is performed.

The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The column signal generation circuit 40 may generate first to $N^{th}$ column signals YI<1:N> (also referred to in the singular as a column signal) for selecting memory cells MC included in first to eighth banks BK1~BK8 constituting the core circuit 60 from the chip selection signal CS and the first to fifth command/address signals CA<1:5> if the write pulse WTAYP or the read pulse RDAYP is inputted to the column signal generation circuit 40. An operation for generating the first to $N^{th}$ column signals YI<1:N> from the chip selection signal CS and the first to fifth command/address signals CA<1:5> is described in detail below with reference to FIG. 2.

The I/O circuit 50 may receive data DATA to generate internal data ID if the write pulse WTAYP is inputted to the I/O circuit 50. The I/O circuit 50 may output the internal data ID to the memory cells MC of the core circuit 60 if the write pulse WTAYP is inputted to the I/O circuit 50. The I/O circuit 50 may receive internal data ID outputted from the memory cells MC to generate data DATA if the read pulse RDAYP is inputted to the I/O circuit 50. The I/O circuit 50 may output the internal data ID as the data DATA if the read pulse RDAYP is inputted to the I/O circuit 50.

The core circuit 60 may include the first to eighth banks BK1~BK8. Each of the first to eighth banks BK1~BK8 may include the plurality of memory cells MC. One of the first to eighth banks BK1~BK8 may be activated by the first to $N^{th}$ column signals YI<1:N> during the write operation. The core circuit 60 may store the internal data ID into the memory cells MC included in one of the first to eighth banks BK1~BK8, which is activated by the first to $N^{th}$ column signals YI<1:N> during the write operation. The core circuit 60 may output the internal data ID stored in the memory cells MC included in one of the first to eighth banks BK1~BK8, which is activated by the first to $N^{th}$ column signals YI<1:N> during the read operation. The core circuit 60 may perform the pre-charge operation if the pre-charge signal PCG is inputted to the core circuit 60. Although FIG.

1 illustrates an example in which the core circuit 60 includes the first to eighth banks BK1~BK8, the number of the banks implemented may be different for different embodiments.

Various logic level combinations of the chip selection signal CS and the first to fifth command/address signals CA<1:5> for generating the write signal WRA enabled during the write operation are described hereinafter with reference to FIG. 2.

The command decoder 10 may generate the write signal WRA, which is enabled if the first to fifth command/address signals CA<1:5> have a first logic level combination while a first pulse of the chip selection signal CS has a logic "high" level and the first to fifth command/address signals CA<1:5> have a third logic level combination while a second pulse of the chip selection signal CS has a logic "high" level. The first logic level combination of the first to fifth command/address signals CA<1:5> may be set to be a logic level combination of 'L,L,H,L,L.' The third logic level combination of the first to fifth command/address signals CA<1:5> may be set to be a logic level combination of 'L,H,L,L,H.'

Various logic level combinations of the chip selection signal CS and the first to fifth command/address signals CA<1:5> for generating the read signal RD enabled during the read operation are described hereinafter with reference to FIG. 2.

The command decoder 10 may generate the read signal RD, which is enabled if the first to fifth command/address signals CA<1:5> have a second logic level combination while a third pulse of the chip selection signal CS has a logic "high" level and the first to fifth command/address signals CA<1:5> have the third logic level combination while a fourth pulse of the chip selection signal CS has a logic "high" level. The second logic level combination of the first to fifth command/address signals CA<1:5> may be set to be a logic level combination of 'L,H,L,L,L.'

An operation for generating the first to $N^{th}$ column signals YI<1:N> from the chip selection signal CS and the first to fifth command/address signals CA<1:5> is described hereinafter with reference to FIG. 2 in conjunction with an example in which the first to $N^{th}$ column signals YI<1:N> are generated while the first pulse and the second pulse of the chip selection signal CS are inputted.

The column signal generation circuit 40 may use the first to third command/address signals CA<1:3> as first to third bank address signals BADD<1:3> for activating the first to eighth banks BK1~BK8 while the first pulse of the chip selection signal CS has a logic "low" level.

The column signal generation circuit 40 may use the fifth command/address signal CA<5> as a first column address signal CADD<1> for selecting the memory cells MC while the first pulse of the chip selection signal CS has a logic "low" level.

The column signal generation circuit 40 may use the first to fifth command/address signals CA<1:5> as second to sixth column address signals CADD<2:6> for selecting the memory cells MC while the second pulse of the chip selection signal CS has a logic "low" level.

Accordingly, the column signal generation circuit 40 may generate the first to $N^{th}$ column signals YI<1:N> for selecting the memory cells MC included in the first to eighth banks BK1~BK8 from the first to third bank address signals BADD<1:3> and the first to sixth column address signals CADD<1:6>.

Meanwhile, an operation for generating the first to $N^{th}$ column signals YI<1:N> while the third and fourth pulses of the chip selection signal CS are inputted may be the same as the operation for generating the first to $N^{th}$ column signals YI<1:N> while the first and second pulses of the chip selection signal CS are inputted. Thus, a detailed description of the operation for generating the first to $N^{th}$ column signals YI<1:N> while the third and fourth pulses of the chip selection signal CS are inputted is omitted hereinafter.

Figure 3:
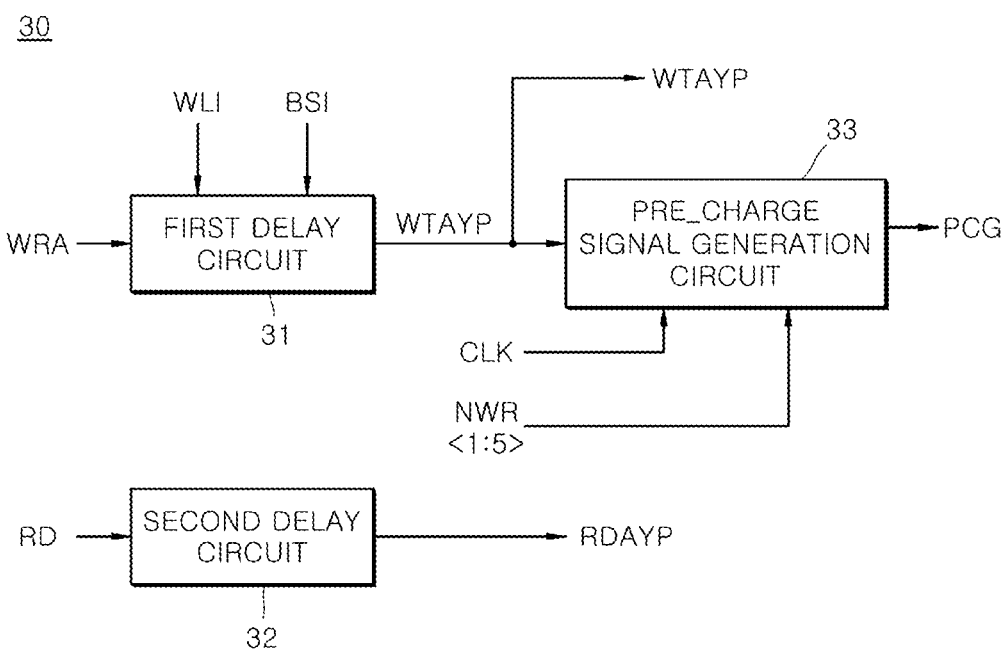
FIG. 3 shows a block diagram illustrating a configuration of a delay circuit included in the semiconductor device of FIG. 1.

Referring to FIG. 3, the delay circuit 30 may include a first delay circuit 31, a second delay circuit 32, and a pre-charge signal generation circuit 33.

The first delay circuit 31 may delay the write signal WRA by a first delay time (P1 of FIG. 7) in response to the write latency information signal WLI and the burst operation information signal BSI to generate the write pulse WTAYP. The first delay circuit 31 may delay the write signal WRA by the first delay time, which is set by the write latency information signal WLI and the burst operation information signal BSI, to generate the write pulse WTAYP. The first delay time may be set to be a sum of the write latency time and the burst operation time.

The second delay circuit 32 may delay the read signal RD to generate the read pulse RDAYP. A delay time of the second delay circuit 32 may be different for different embodiments.

The pre-charge signal generation circuit 33 may delay the write pulse WTAYP by a second delay time (P2 of FIG. 7) according to the first to fifth write recovery signals NWR<1:5> to generate the pre-charge signal PCG. The second delay time may be set to be equal to or longer than one cycle of the clock signal CLK.

Figure 4:
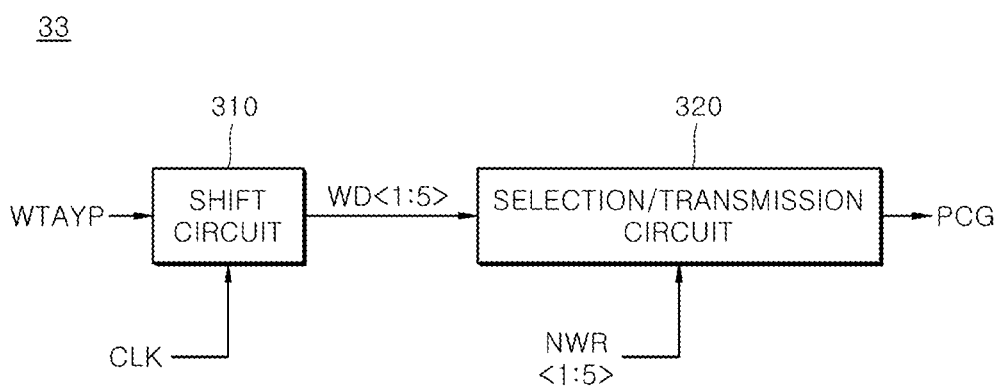
FIG. 4 shows a block diagram illustrating a configuration of a pre-charge signal generation circuit included in the delay circuit of FIG. 3.

Referring to FIG. 4, the pre-charge signal generation circuit 33 may include a shift circuit 310 and a selection/transmission circuit 320.

The shift circuit 310 may delay the write pulse WTAYP in synchronization with the clock signal CLK to generate first to fifth write delay signals WD<1:5> (also referred to in the singular as a write delay signal) which are sequentially enabled. The shift circuit 310 may delay the write pulse WTAYP to generate the first to fifth write delay signals WD<1:5>, which are sequentially enabled every cycle of the clock signal CLK.

The selection/transmission circuit 320 may output one of the first to fifth write delay signals WD<1:5> as the pre-charge signal PCG according to the first to fifth write recovery signals NWR<1:5>. For example, the selection/transmission circuit 320 may output the first write delay signal WD<1> as the pre-charge signal PCG if the first write recovery signal NWR<1> is enabled. Similarly, the selection/transmission circuit 320 may output the fifth write delay signal WD<5> as the pre-charge signal PCG if the fifth write recovery signal NWR<5> is enabled.

Figure 5:
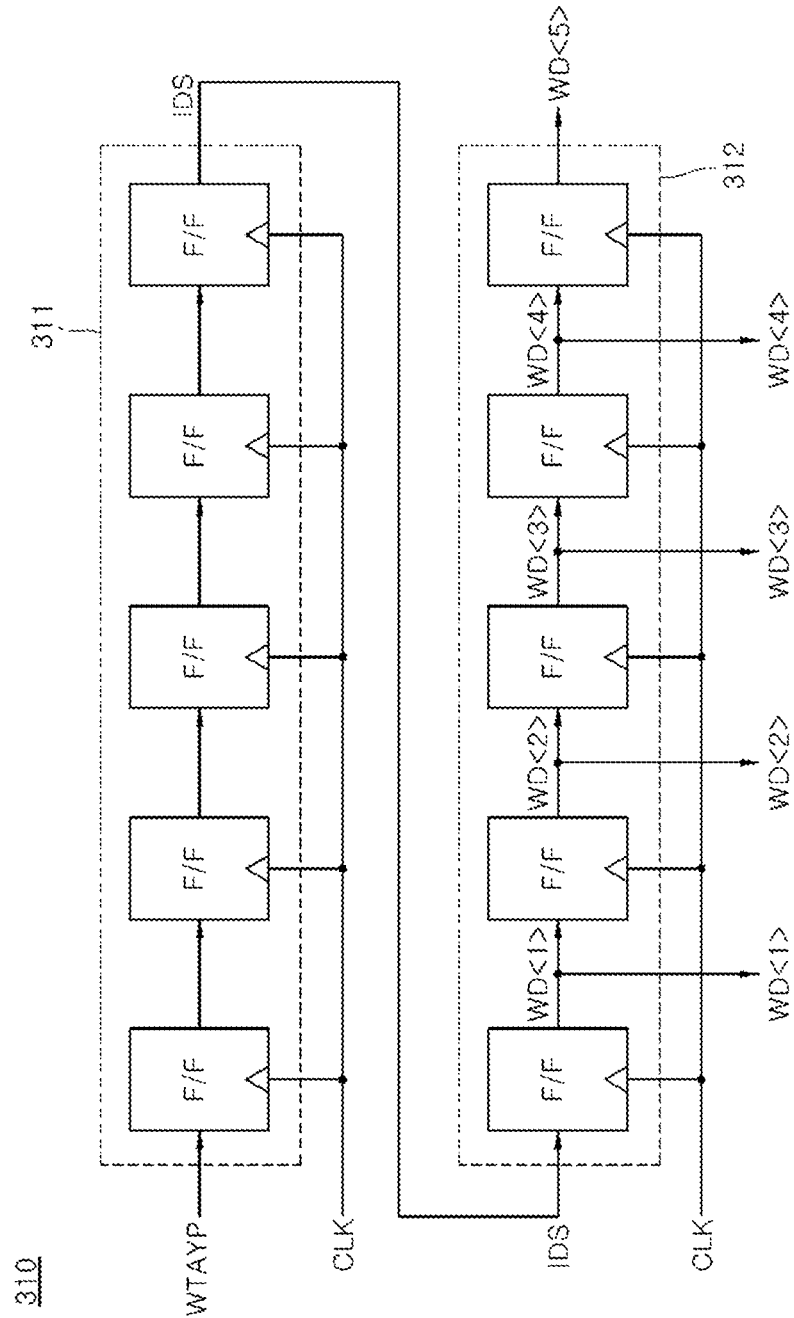
FIG. 5 shows a block diagram illustrating a configuration of a shift circuit included in the pre-charge signal generation circuit of FIG. 4.

Referring to FIG. 5, the shift circuit 310 may include an internal delay signal generation circuit 311 and a write delay signal generation circuit 312.

The internal delay signal generation circuit 311 may be realized using a plurality of flip-flops F/F. The internal delay signal generation circuit 311 may delay the write pulse WTAYP using the plurality of flip-flops F/F synchronized with the clock signal CLK to generate an internal delay signal IDS. The number of the flip-flops F/F included in the internal delay signal generation circuit 311 may be different for different embodiments. A delay time of the internal delay signal generation circuit 311 may be set differently according to the number of the flip-flops F/F.

The write delay signal generation circuit 312 may be realized using a plurality of flip-flops F/F. The write delay signal generation circuit 312 may delay the internal delay signal IDS using the plurality of flip-flops F/F synchronized with the clock signal CLK to generate the first to fifth write delay signals WD<1:5>. The write delay signal generation circuit 312 may delay the internal delay signal IDS by one cycle of the clock signal CLK to generate the first write delay signal WD<1>. The write delay signal generation circuit 312 may delay the first write delay signal WD<1> by one cycle of the clock signal CLK to generate the second write delay signal WD<2>. The write delay signal generation circuit 312 may delay the second write delay signal WD<2> by one cycle of the clock signal CLK to generate the third write delay signal WD<3>. The write delay signal generation circuit 312 may delay the third write delay signal WD<3> by one cycle of the clock signal CLK to generate the fourth write delay signal WD<4>. The write delay signal generation circuit 312 may delay the fourth write delay signal WD<4> by one cycle of the clock signal CLK to generate the fifth write delay signal WD<5>. The number of the flip-flops F/F included in the write delay signal generation circuit 312 may be different for different embodiments. A delay time of the write delay signal generation circuit 312 may be set differently according to the number of the flip-flops F/F.

Figure 6:
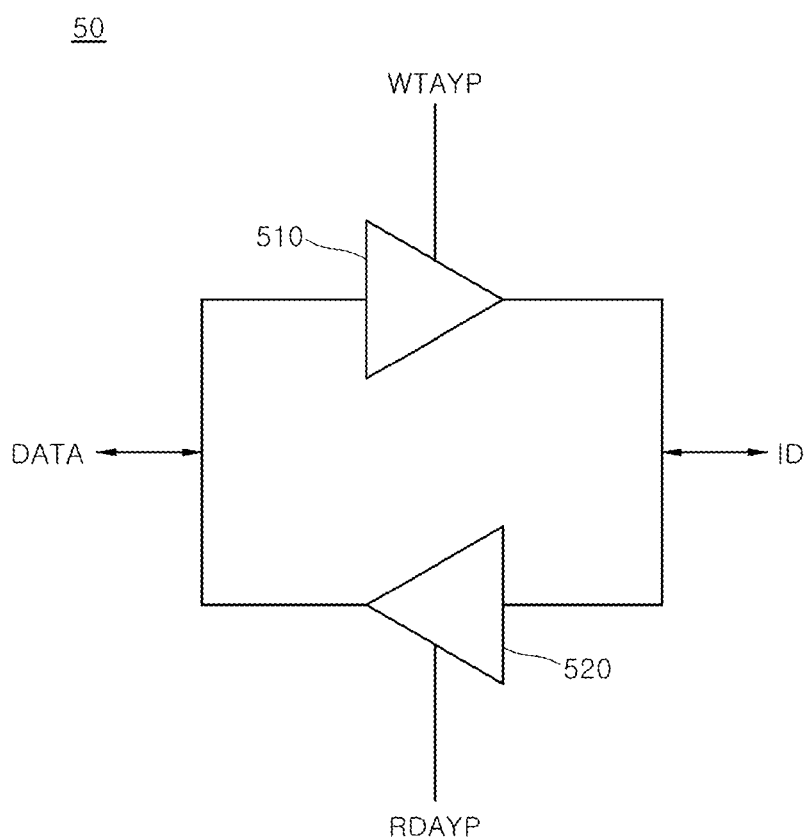
FIG. 6 shows a circuit diagram illustrating a configuration of an input/output (I/O) circuit included in the semiconductor device of FIG. 1.

Referring to FIG. 6, the I/O circuit 50 may include a write driver 510 and a read driver 520.

The write driver 510 may buffer the data DATA provided by an external device to generate the internal data ID during the write operation. The write driver 510 may buffer the data DATA provided by an external device to generate the internal data ID if the write pulse WTAYP is enabled. The write driver 510 may output the internal data ID to the core circuit 60 if the write pulse WTAYP is enabled.

The read driver 520 may buffer the internal data ID outputted from the core circuit 60 to generate the data DATA during the read operation. The read driver 520 may buffer the internal data ID outputted from the core circuit 60 to generate the data DATA if the read pulse RDAYP is enabled. The read driver 520 may output the data DATA to an external device if the read pulse RDAYP is enabled.

Figure 7:
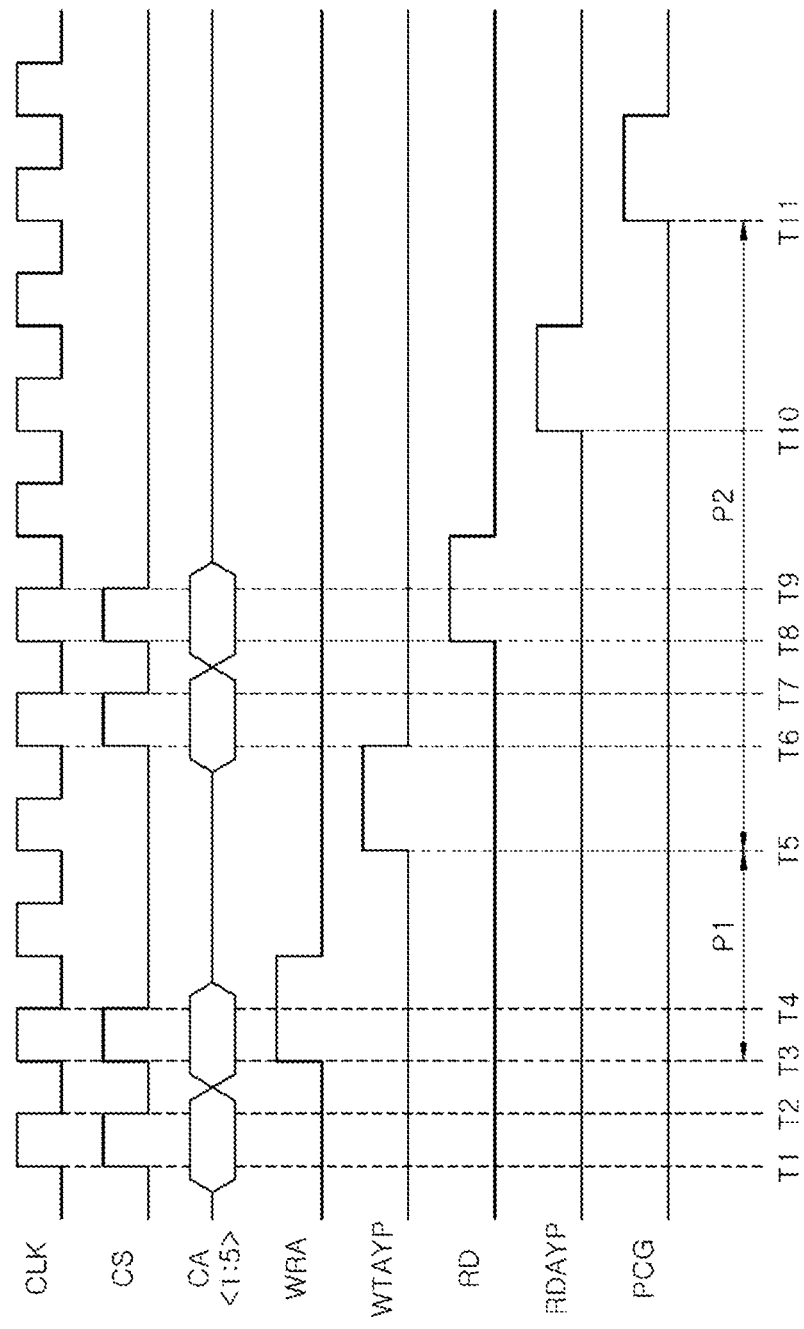
FIG. 7 shows a timing diagram illustrating an operation of a semiconductor device, according to an embodiment of the present disclosure.

An operation of the semiconductor device 101 according to an embodiment is described with reference to FIG. 7 in conjunction with a case for which the write operation, the read operation, and the pre-charge operation are sequentially performed.

At time "T1," the command decoder 10 may receive the first to fifth command/address signals CA<1:5> having the first logic level combination while the first pulse of the chip selection signal CS has a logic "high" level.

At time "T2," the column signal generation circuit 40 may receive the first to third command/address signals CA<1:3> as the first to third bank address signals BADD<1:3> for activating the first to eighth banks BK1~BK8 while the first pulse of the chip selection signal CS has a logic "low" level. The column signal generation circuit 40 may receive the fifth command/address signal CA<5> as the first column address signal CADD<1> for selecting the memory cells MC while the first pulse of the chip selection signal CS has a logic "low" level.

At time "T3," the command decoder 10 may receive the first to fifth command/address signals CA<1:5> having the third logic level combination while the second pulse of the chip selection signal CS has a logic "high" level. The command decoder 10 may generate the write signal WRA which is enabled to have a logic "high" level by the first to fifth command/address signals CA<1:5> received at the time "T1" and the first to fifth command/address signals CA<1:5> received at the time "T3."

At time "T4," the column signal generation circuit 40 may receive the first to fifth command/address signals CA<1:5> as the second to sixth column address signals CADD<2:6> for selecting the memory cells MC while the second pulse of the chip selection signal CS has a logic "low" level.

At time "T5," the first delay circuit 31 of the delay circuit 30 may delay the write signal WRA generated at the time "T3" by the first delay time P1 to generate the write pulse WTAYP having a logic "high" level. The first delay time P1 may be set to be a sum of the write latency time and the burst operation time.

The column signal generation circuit 40 may generate the first to N$^{th}$ column signals YI<1:N> for selecting the memory cells MC included in the first to eighth banks BK1~BK8 from the first to third bank address signals BADD<1:3> and the first column address signal CADD<1> received at the time "T2" as well as the second to sixth column address signals CADD<2:6> received at the time "T4," in response to the write pulse WTAYP having a logic "high" level.

The write driver 510 of the I/O circuit 50 may receive the data DATA from an external device in response to the write pulse WTAYP having a logic "high" level to generate the internal data ID. The write driver 510 may output the internal data ID to the core circuit 60 in response to the write pulse WTAYP having a logic "high" level.

The core circuit 60 may activate one of the first to eighth banks BK1~BK8 in response to the first to N$^{th}$ column signals YI<1:N>. The core circuit 60 may store the data DATA in one or more memory cells selected from the memory cells MC included in any one of the first to eighth banks BK1~BK8, which is activated by the first to N$^{th}$ column signals YI<1:N>.

At time "T6," the command decoder 10 may receive the first to fifth command/address signals CA<1:5> having the second logic level combination while the third pulse of the chip selection signal CS has a logic "high" level.

At time "T7," the column signal generation circuit 40 may receive the first to third command/address signals CA<1:3> as the first to third bank address signals BADD<1:3> for activating the first to eighth banks BK1~BK8 while the third pulse of the chip selection signal CS has a logic "low" level. The column signal generation circuit 40 may receive the fifth command/address signal CA<5> as the first column address signal CADD<1> for selecting the memory cells MC while the third pulse of the chip selection signal CS has a logic "low" level.

At time "T8," the command decoder 10 may receive the first to fifth command/address signals CA<1:5> having the third logic level combination while the fourth pulse of the chip selection signal CS has a logic "high" level. The command decoder 10 may generate the read signal RD which is enabled to have a logic "high" level by the first to fifth command/address signals CA<1:5> received at the time "T6" and the first to fifth command/address signals CA<1:5> received at the time "T8."

At time "T9," the column signal generation circuit 40 may receive the first to fifth command/address signals CA<1:5> as the second to sixth column address signals CADD<2:6> for selecting the memory cells MC while the fourth pulse of the chip selection signal CS has a logic "low" level.

At time "T10," the second delay circuit 32 of the delay circuit 30 may delay the read signal RD generated at the time "T8" to generate the read pulse RDAYP having a logic "high" level.

The column signal generation circuit 40 may generate the first to N$^{th}$ column signals YI<1:N> for selecting the memory cells MC included in the first to eighth banks BK1~BK8 from the first to third bank address signals BADD<1:3> and the first column address signal CADD<1> received at the time "T7" as well as the second to sixth column address signals CADD<2:6> received at the time "T9," in response to the read pulse RDAYP having a logic "high" level.

The core circuit 60 may output the internal data ID stored in one or more memory cells selected from the memory cells MC included in any one of the first to eighth banks BK1~BK8, which is activated by the first to N$^{th}$ column signals YI<1:N>. In such a case, the bank activated during the read operation may be the same bank as activated during the write operation.

The read driver 520 of the I/O circuit 50 may generate the data DATA from the internal data ID in response to the read pulse RDAYP having a logic "high" level. The read driver 520 may output the data DATA to an external device in response to the read pulse RDAYP having a logic "high" level.

At time "T11," the pre-charge signal generation circuit 33 of the delay circuit 30 may delay the write pulse WTAYP generated at the time "T5" by the second delay time P2 according to the first to fifth write recovery signals NWR<1:5> to generate the pre-charge signal PCG having a logic "high" level.

The core circuit 60 may perform the pre-charge operation in response to the pre-charge signal PCG having a logic "high" level.

Meanwhile, the predetermined period set to be longer than the write recovery time tWR may correspond to a time period between the time "T3" and the time "T11." That is, the predetermined period may be set as a time period corresponding to a sum of the first delay time P1 and the second delay time P2.

As described above, a semiconductor device according to an embodiment may sequentially perform a write operation, a read operation, and a pre-charge operation by generating a write pulse for performing the write operation from command/address signals, by generating a read pulse for performing the read operation from command/address signals, and by delaying the write pulse by a predetermined delay time to generate a pre-charge signal. In addition, the semiconductor device may realize improved operation speed by continuously performing the write operation and the read operation for the same bank without execution of the pre-charge operation between the write operation and the read operation and by performing the pre-charge operation after the read operation.

Moreover, the semiconductor device may improve an operation speed by continuously performing the write operation and the read operation for a certain bank without activation of the certain bank before the read operation.

Figure 8:
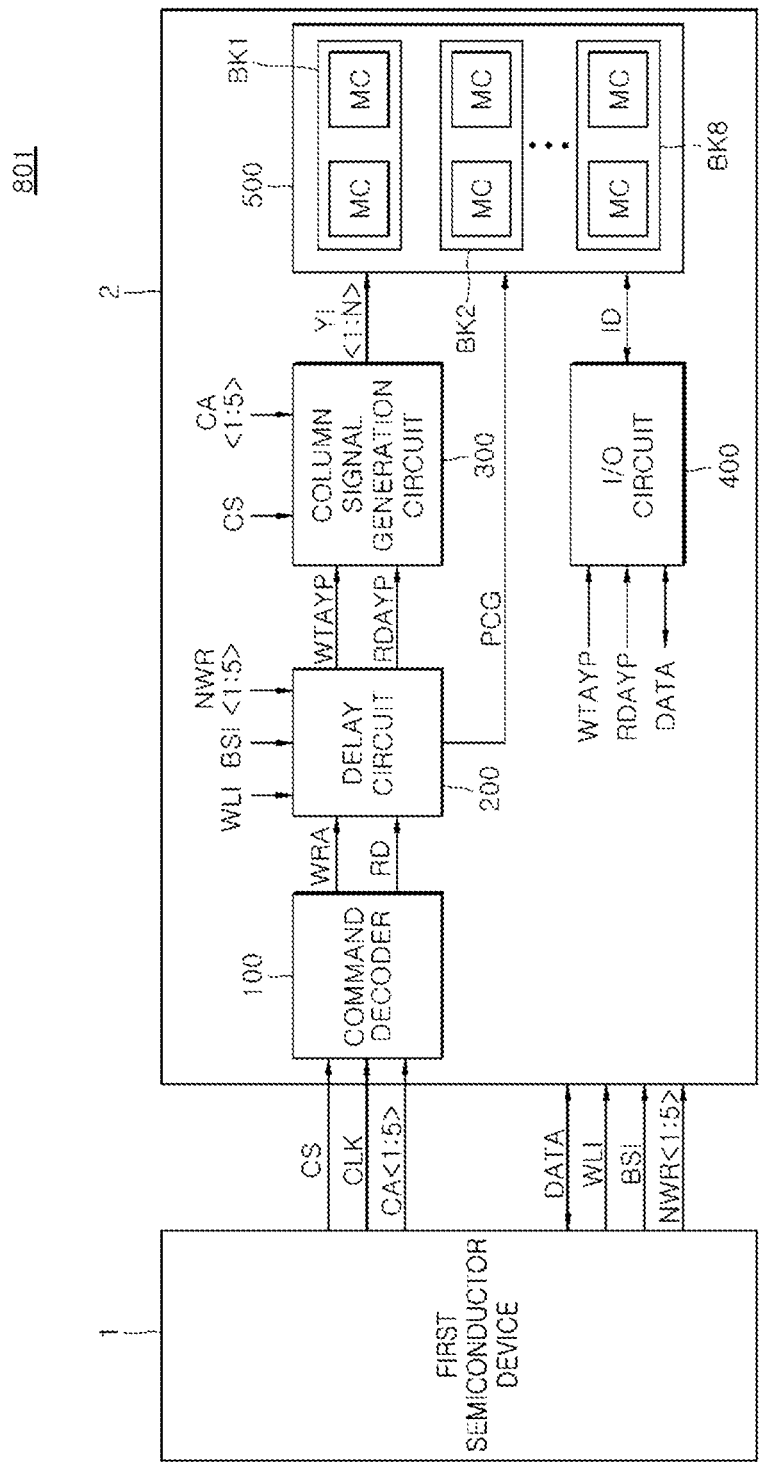
FIG. 8 shows a block diagram illustrating a configuration of a semiconductor system, according to an embodiment of the present disclosure.

FIG. 8 shows a block diagram illustrating a configuration of a semiconductor system 801 according to an embodiment.

As illustrated in FIG. 8, the semiconductor system 801 may include a first semiconductor device 1 and a second semiconductor device 2.

The first semiconductor device 1 may output a chip selection signal CS, a clock signal CLK, and first to fifth command/address signals CA<1:5>. The chip selection signal CS may be a signal that activates the second semiconductor device 2 to apply the first to fifth command/address signals CA<1:5> to the second semiconductor device 2. The chip selection signal CS may include first to fourth pulses which are sequentially created. The first to fourth pulses of the chip selection signal CS may be sequentially created to have a logic "high" level. In some other embodiments, the pulses of the chip selection signal CS may be set to have a logic "low" level. The clock signal CLK may be set as a signal which is periodically togged to synchronize the first semiconductor device 1 with the second semiconductor device 2. The first to fifth command/address signals CA<1:5> may include a command and an address for controlling an operation of the second semiconductor device 2.

The first semiconductor device 1 may output a write latency information signal WLI, a burst operation information signal BSI, and first to fifth write recovery signals NWR<1:5>. The write latency information signal WLI may be a signal for setting a write latency time. The write latency information signal WLI may include information on a time necessary for the input of data from a time when the first to fifth command/address signals CA<1:5> for a write operation are inputted to the second semiconductor device 2. Even though FIG. 8 illustrates the write latency information signal WLI with a single line, the write latency information signal WLI may be set as a signal including a plurality of bits for some embodiments. The burst operation information signal BSI may be a signal for setting a burst operation time. The burst operation information signal BSI may include information on a burst length of data processed during the write operation and a read operation that are performed when the command/address signals CA<1:5> are inputted once. Even though FIG. 8 illustrates the burst operation information signal BSI with a single line, the burst operation information signal BSI may be set as a signal including a plurality of bits for some embodiments. The first to fifth write recovery signals NWR<1:5> may be signals for setting a write recovery time tWR. Even though the first to fifth write recovery signals NWR<1:5> are denoted as including five bits, the number of bits included in the write recovery signals may be set to be less or greater than five in other embodiments.

The first semiconductor device 1 may output data DATA to the second semiconductor device 2 during the write operation. The first semiconductor device 1 may receive the data DATA from the semiconductor device 2 during the read operation.

The second semiconductor device 2 may include a command decoder 100, a delay circuit 200, a column signal generation circuit 300, an input/output (I/O) circuit 400, and a core circuit 500.

The command decoder 100 may be synchronized with the clock signal CLK to generate a write signal WRA and a read signal RD, which are sequentially enabled according to the chip selection signal CS and a logic level combination of the first to fifth command/address signals CA<1:5>. The command decoder 100 may be synchronized with the clock signal CLK to generate the write signal WRA according to a logic level combination of the first to fifth command/address signals CA<1:5> while the first pulse and the second pulse of the chip selection signal CS are inputted to the command decoder 100. The command decoder 100 may be synchronized with the clock signal CLK to generate the read signal RD according to a logic level combination of the first to fifth command/address signals CA<1:5> while the third pulse and the fourth pulse of the chip selection signal CS are inputted to the command decoder 100. The chip selection signal CS and logic level combinations of the first to fifth command/address signals CA<1:5> for generating the write signal WRA and the read signal RD may be set to be the same as illustrated in FIG. 2. Accordingly, detailed descriptions of the chip selection signal CS and logic level combinations of the first to fifth command/address signals CA<1:5> for generating the write signal WRA and the read signal RD are omitted hereinafter.

The delay circuit 200 may receive the write signal WRA and the read signal RD to generate a write pulse WTAYP, a read pulse RDAYP, and a pre-charge signal PCG, which are sequentially enabled. The delay circuit 200 may delay the write signal WRA by a sum of the write latency time and the burst operation time to generate the write pulse WTAYP. The delay circuit 200 may delay the read signal RD to generate the read pulse RDAYP. The delay circuit 200 may generate the pre-charge signal PCG, which is enabled after a predetermined period elapses from a time when the write signal WRA is generated. The delay circuit 200 may delay the write signal WRA according to the write latency information signal WLI and the burst operation information signal BSI to generate the write pulse WTAYP. The delay circuit 200 may delay write pulse WTAYP according to the first to fifth write recovery signals NWR<1:5> to generate the pre-charge signal PCG. The predetermined period may be set as a time which is greater than a total operation time of the write operation and the read operation that are sequentially performed. The predetermined period may be set to be longer than the write recovery time tWR. The write recovery time tWR may be set as a minimum delay time for performing a pre-charge operation from a time when the data DATA are inputted to the second semiconductor device 2 during the write operation. That is, the write recovery time tWR may be set as a minimum interval time between a time when the data DATA are inputted to the second semiconductor device 2 during the write operation and a time when the pre-charge operation is performed.

The column signal generation circuit 300 may generate first to $N^{th}$ column signals YI<1:N> for selecting memory cells MC included in first to eighth banks BK1~B8 constituting the core circuit 500 from the chip selection signal CS and the first to fifth command/address signals CA<1:5> if the write pulse WTAYP or the read pulse RDAYP is inputted to the column signal generation circuit 300. An operation for generating the first to $N^{th}$ column signals YI<1:N> from the chip selection signal CS and the first to fifth command/address signals CA<1:5> may be the same as illustrated in FIG. 2. Accordingly, detailed descriptions of the operation for generating the first to $N^{th}$ column signals YI<1:N> from the chip selection signal CS and the first to fifth command/address signals CA<1:5> are omitted hereinafter.

The I/O circuit 400 may receive the data DATA from the first semiconductor device 1 to generate internal data ID if the write pulse WTAYP is inputted to the I/O circuit 400. The I/O circuit 400 may output the internal data ID to the memory cells MC of the core circuit 500 if the write pulse WTAYP is inputted to the I/O circuit 400. The I/O circuit 400 may receive the internal data ID from the memory cells MC of the core circuit 500 to generate the data DATA if the read pulse RDAYP is inputted to the I/O circuit 400. The I/O circuit 400 may output the data DATA to the first semiconductor device 1 if the read pulse RDAYP is inputted to the I/O circuit 400.

The core circuit 500 may include the first to eighth banks BK1~BK8. Each of the first to eighth banks BK1~BK8 may include the plurality of memory cells MC. One of the first to eighth banks BK1~BK8 may be activated by the first to $N^{th}$ column signals YI<1:N> during the write operation. The core circuit 500 may store the internal data ID into the memory cells MC included in one of the first to eighth banks BK1~BK8, which is activated by the first to $N^{th}$ column signals YI<1:N> during the write operation. The core circuit 500 may output the internal data ID stored in the memory cells MC included in one of the first to eighth banks BK1~BK8, which is activated by the first to $N^{th}$ column signals YI<1:N> during the read operation. The core circuit 500 may perform the pre-charge operation if the pre-charge signal PCG is inputted to the core circuit 500. Although FIG. 8 illustrates an example in which the core circuit 500 includes the first to eighth banks BK1~BK8, the number of the banks may be different for different embodiments.

As described above, the second semiconductor device 2 may be synchronized with the clock signal CLK outputted from the first semiconductor device 1 to sequentially perform the write operation, the read operation, and the pre-charge operation according to the chip selection signal CS and a logic level combination of the first to fifth command/address signals CA<1:5>. The second semiconductor device 2 may continuously perform the write operation and the read operation for the same bank according to the write latency information signal WLI, the burst operation information signal BSI, and the first to fifth write recovery signals NWR<1:5> and may perform the pre-charge operation after the read operation.

The command decoder 100, the delay circuit 200, the column signal generation circuit 300, the I/O circuit 400, and the core circuit 500 included in the second semiconductor device 2 may have substantially the same configurations as the command decoder 10, the delay circuit 30, the column signal generation circuit 40, the I/O circuit 50, and the core circuit 60 included in the semiconductor device 101 illustrated in FIG. 1, respectively. Thus, detailed descriptions of the command decoder 100, the delay circuit 200, the column signal generation circuit 300, the I/O circuit 400, and the core circuit 500 are omitted here.

Figure 9:
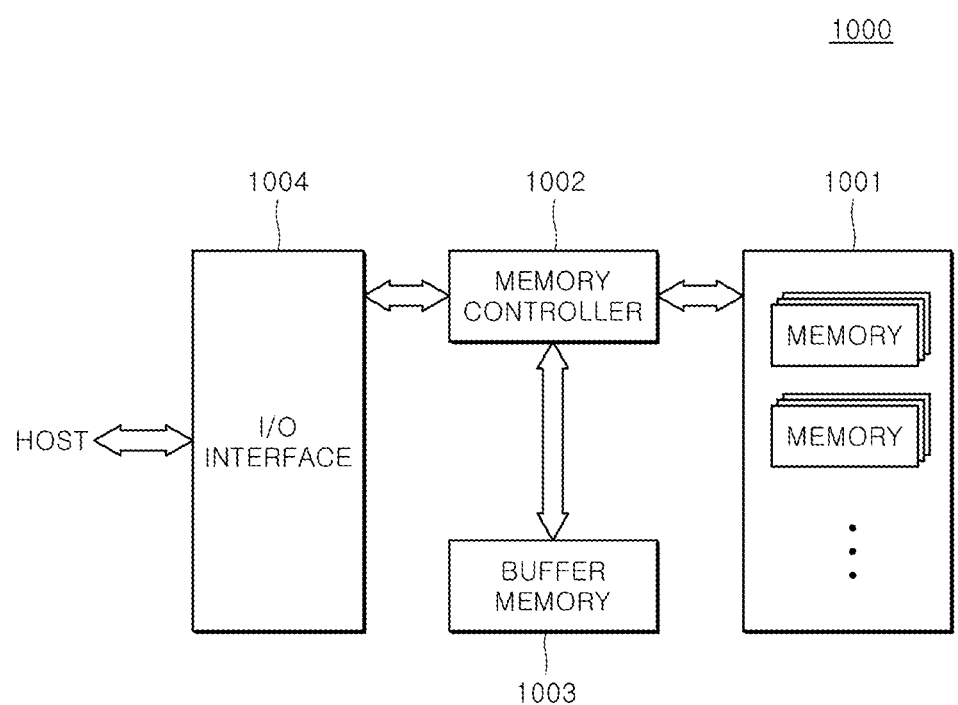
FIG. 9 shows a block diagram illustrating a configuration of an electronic system including the semiconductor device or the semiconductor system shown in FIGS. 1 to 8.

The semiconductor device 101 or the semiconductor system 801 described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. Meanwhile, the data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 8. Although FIG. 9 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may include the semiconductor device 101 illustrated in FIG. 1 or the second semiconductor device 2 illustrated in FIG. 8 to sequentially perform a write operation, a read operation, and a pre-charge operation by generating a write pulse for performing the write operation from command/address signals, by generating a read pulse for performing the read operation from command/address signals, and by delaying the write pulse by a predetermined delay time to generate a pre-charge signal. Thus, the buffer memory 1003 may improve operation speed by continuously performing the write operation and the read operation for the same bank without execution of the pre-charge operation between the write operation and the read operation and by performing the pre-charge operation after the read operation. Moreover, the buffer memory 1003 may improve operation speed by continuously performing the write operation and the read operation for a certain bank without activation of the certain bank before the read operation. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or as an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a delay circuit configured to delay a write signal by a sum of a write latency time and a burst operation time to generate a write pulse, configured to delay a read signal to generate a read pulse, and configured to generate a pre-charge signal, wherein the pre-charge signal is enabled after a predetermined period elapses from a time when the write signal is generated; and
a column signal generation circuit configured to generate a column signal, for selecting at least one memory cell included in one of a plurality of banks, from a chip selection signal and a command/address signal when the write pulse or the read pulse is inputted to the column signal generation circuit.

2. The semiconductor device of claim 1, wherein a bank activated by the column signal during a read operation is the same bank as activated by the column signal during a write operation.

3. The semiconductor device of claim 1, wherein the predetermined period is set to be greater than a total operation time of a write operation and a read operation that are sequentially performed.

4. The semiconductor device of claim 1,
wherein the predetermined period is set to be longer than a write recovery time; and
wherein the write recovery time is set as a minimum delay time for performing a pre-charge operation from a time when data are inputted to the semiconductor device during a write operation.

5. The semiconductor device of claim 1, wherein the delay circuit comprises:
a first delay circuit configured to delay the write signal by a first delay time, in response to a write latency information signal and a burst operation information signal, to generate the write pulse;
a second delay circuit configured to delay the read signal to generate the read pulse; and
a pre-charge signal generation circuit configured to delay the write pulse, by a second delay time according to a write recovery signal, to generate the pre-charge signal.

6. The semiconductor device of claim 5,
wherein the write latency information signal is a signal for setting the write latency time;
wherein the burst operation information signal is a signal for setting the burst operation time; and
wherein the first delay time is set as a sum of the write latency time and the burst operation time.

7. The semiconductor device of claim 5,
wherein the write recovery signal is a signal for delaying the write pulse by the second delay time; and
wherein the second delay time is set to be equal to or longer than one cycle of a clock signal.

8. The semiconductor device of claim 5, wherein the predetermined period is set to be a sum of the first delay time and the second delay time.

9. The semiconductor device of claim 5, wherein the pre-charge signal generation circuit comprises:
a shift circuit configured to delay the write pulse in synchronization with a clock signal to generate a plurality of write delay signals; and
a selection/transmission circuit configured to output one of the plurality of write delay signals as the pre-charge signal according to the write recovery signal.

10. The semiconductor device of claim 9, wherein the shift circuit comprises:
an internal delay signal generation circuit configured to delay the write pulse in synchronization with the clock signal to generate an internal delay signal; and
a write delay signal generation circuit configured to delay the internal delay signal in synchronization with the clock signal to generate the plurality of write delay signals, wherein the plurality of write delay signals are sequentially created.

11. A semiconductor device comprising:
a command decoder configured to be synchronized with a clock signal to generate a write signal and a read signal, wherein the write signal and the read signal are sequentially enabled according to a chip selection signal and
a logic level combination of a command/address signal;
a delay circuit configured to delay the write signal by a
first delay time according to a write latency information
signal and a burst operation information signal to
generate a write pulse, configured to delay the read
signal to generate a read pulse, and configured to delay
the write pulse by a second delay time according to a
write recovery signal to generate a pre-charge signal;
and
a column signal generation circuit configured to generate
a column signal, for selecting at least one memory cell
included in one of a plurality of banks, from the chip
selection signal and the command/address signal when
the write pulse or the read pulse is inputted to the
column signal generation circuit.

12. The semiconductor device of claim 11,
wherein the command decoder generates the write signal
when the command/address signal has a first logic level
combination while a first pulse of the chip selection
signal is inputted to the command decoder and when
the command/address signal has a third logic level
combination while a second pulse of the chip selection
signal is inputted to the command decoder; and
wherein the command decoder generates the read signal
when the command/address signal has a second logic
level combination while a third pulse of the chip
selection signal is inputted to the command decoder
and when the command/address signal has the third
logic level combination while a fourth pulse of the chip
selection signal is inputted to the command decoder.

13. The semiconductor device of claim 11, wherein the column signal generation circuit generates the column signal from the command/address signal during a period for which the chip selection signal has a predetermined logic level.

14. The semiconductor device of claim 11, wherein a bank activated by the column signal during a read operation is the same bank as activated by the column signal during a write operation.

15. The semiconductor device of claim 11,
wherein the first delay time is set as a sum of a write latency time and a burst operation time; and
wherein the second delay time is set to be equal to or longer than one cycle of a clock signal.

16. The semiconductor device of claim 11, wherein each of the plurality of banks sequentially performs a write operation, a read operation, and a pre-charge operation.

17. The semiconductor device of claim 11, wherein the delay circuit comprises:
a first delay circuit configured to delay the write signal by the first delay time, in response to the write latency information signal and the burst operation information signal, to generate the write pulse;
a second delay circuit configured to delay the read signal to generate the read pulse; and
a pre-charge signal generation circuit configured to delay the write pulse, by the second delay time according to the write recovery signal, to generate the pre-charge signal.

18. The semiconductor device of claim 17,
wherein the write latency information signal is a signal for setting a write latency time; and
wherein the burst operation information signal is a signal for setting a burst operation time.

19. The semiconductor device of claim 17, wherein the pre-charge signal generation circuit comprises:
a shift circuit configured to delay the write pulse in synchronization with the clock signal to generate a plurality of write delay signals; and
a selection/transmission circuit configured to output one of the plurality of write delay signals as the pre-charge signal according to the write recovery signal.

20. The semiconductor device of claim 19, wherein the shift circuit comprises:
an internal delay signal generation circuit configured to delay the write pulse in synchronization with the clock signal to generate an internal delay signal; and
a write delay signal generation circuit configured to delay the internal delay signal in synchronization with the clock signal to generate the plurality of write delay signals, wherein the plurality of write delay signals are sequentially created.

21. The semiconductor device of claim 11, further comprising:
a mode register configured to output the write latency information signal for setting a write latency time, configured to output the burst operation information signal for setting a burst operation time, and configured to output the write recovery signal;
a core circuit configured to include the plurality of banks, each of which includes multiple memory cells, configured to store internal data in at least one memory cell, of the multiple memory cells, selected by the column signal during a write operation, configured to output the internal data stored in at least one memory cell, of the multiple memory cells, selected by the column signal during a read operation, and configured to perform a pre-charge operation according to the pre-charge signal; and
an input/output (I/O) circuit configured to receive data to generate the internal data and to output the internal data to the to the at least one memory cell selected by the column signal during the write operation when the write pulse is inputted to the I/O circuit and configured to output the internal data stored in the at least one memory cell selected by the column signal during the read operation as data when the read pulse is inputted to the I/O circuit.

22. The semiconductor device of claim 21, wherein the I/O circuit comprises:
a write driver configured to receive data to generate the internal data and to output the internal data to the memory cells when the write pulse in inputted to the write driver; and
a read driver configured to output the internal data stored in the memory cells as data when the read pulse is inputted to the read driver.

23. A semiconductor system comprising:
a first semiconductor device configured to output a chip selection signal, a clock signal, a command/address signal, a write latency information signal, a burst operation information signal, and a write recovery signal and configured to at least one of receive and output data; and
a second semiconductor device configured to be synchronized with the clock signal to sequentially perform a write operation and a read operation for a bank activated according to the chip selection signal and a logic level combination of the command/address signal and configured to be synchronized with the clock signal to perform a pre-charge operation according to the write latency information signal, the burst operation information signal, and the write recovery signal after the read operation is performed.

24. The semiconductor system of claim 23,
wherein the pre-charge operation is performed after a predetermined period elapses from a time when the write operation starts; and
wherein the predetermined period is set to be longer than a total operation time of the write operation and the read operation, which are sequentially performed.

25. The semiconductor system of claim 24,
wherein the predetermined period is set to be longer than a write recovery time; and
wherein the write recovery time is set as a minimum delay time for performing the pre-charge operation from a time when data are inputted to the second semiconductor device during the write operation.

26. The semiconductor system of claim 23, wherein the second semiconductor device comprises:
a command decoder configured to be synchronized with the clock signal to generate a write signal and a read signal, wherein the write signal and the read signal are sequentially enabled according to the chip selection signal and a logic level combination of the command/address signal;
a delay circuit configured to delay the write signal by a first delay time according to the write latency information signal and the burst operation information signal to generate a write pulse, configured to delay the read signal to generate a read pulse, and configured to delay the write pulse by a second delay time according to the write recovery signal to generate a pre-charge signal;
a column signal generation circuit configured to generate a column signal from the chip selection signal and the command/address signal when the write pulse or the read pulse is inputted to the column signal generation circuit;
an input/output (I/O) circuit configured to receive data to generate internal data when the write pulse is inputted to the I/O circuit and configured to output the internal data as data when the read pulse is inputted to the I/O circuit; and
a core circuit configured to include the activated bank having a plurality of memory cells, configured to store the internal data in at least one of the plurality of memory cells selected by the column signal during the write operation, configured to output the internal data stored in at least one of the plurality of memory cells selected by the column signal during the read operation, and configured to perform the pre-charge operation according to the pre-charge signal.

27. The semiconductor system of claim 26,
wherein the command decoder generates the write signal when the command/address signal has a first logic level combination while a first pulse of the chip selection signal is inputted to the command decoder and when the command/address signal has a third logic level combination while a second pulse of the chip selection signal is inputted to the command decoder; and
wherein the command decoder generates the read signal when the command/address signal has a second logic level combination while a third pulse of the chip selection signal is inputted to the command decoder and when the command/address signal has the third logic level combination while a fourth pulse of the chip selection signal is inputted to the command decoder.

28. The semiconductor system of claim 26, wherein the column signal generation circuit generates the column signal from the command/address signal during a period for which the chip selection signal has a predetermined logic level.

29. The semiconductor system of claim 26, wherein a bank activated by the column signal during the write operation is the same bank as activated by the column signal during the read operation.

30. The semiconductor system of claim 26, wherein the delay circuit comprises:
a first delay circuit configured to delay the write signal by the first delay time, in response to the write latency information signal and the burst operation information signal, to generate the write pulse;
a second delay circuit configured to delay the read signal to generate the read pulse; and
a pre-charge signal generation circuit configured to delay the write pulse by the second delay time according to the write recovery signal to generate the pre-charge signal.

31. The semiconductor system of claim 30,
wherein the first delay time is set as a sum of a write latency time and a burst operation time; and
wherein the second delay time is set to be equal to or longer than one cycle of the clock signal.

32. The semiconductor system of claim 30, wherein the pre-charge signal generation circuit comprises:
a shift circuit configured to delay the write pulse in synchronization with the clock signal to generate a plurality of write delay signals; and
a selection/transmission circuit configured to output one of the plurality of write delay signals as the pre-charge signal according to the write recovery signal.

33. The semiconductor system of claim 32, wherein the shift circuit comprises:
an internal delay signal generation circuit configured to delay the write pulse in synchronization with the clock signal to generate an internal delay signal; and
a write delay signal generation circuit configured to delay the internal delay signal in synchronization with the clock signal to generate the plurality of write delay signals, wherein the plurality of write delay signals are sequentially created.

* * * * *